United States Patent
Lee et al.

(10) Patent No.: US 8,247,257 B2
(45) Date of Patent: *Aug. 21, 2012

(54) METHOD AND MATERIAL FOR PROCESSING IRON DISILICIDE FOR PHOTOVOLTAIC APPLICATION

(75) Inventors: Howard W. H. Lee, Saratoga, CA (US); Frederic Victor Mikulec, Redwood City, CA (US); Bing Shen Gao, Los Altos, CA (US); Jinman Huang, Fremont, CA (US)

(73) Assignee: Stion Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/267,239

(22) Filed: Oct. 6, 2011

(65) Prior Publication Data
US 2012/0028405 A1 Feb. 2, 2012

Related U.S. Application Data

(63) Continuation of application No. 12/210,173, filed on Sep. 12, 2008, now Pat. No. 8,058,092.

(60) Provisional application No. 60/976,317, filed on Sep. 28, 2007.

(51) Int. Cl.
*H01L 21/00* (2006.01)
*H01L 21/44* (2006.01)

(52) U.S. Cl. ............ 438/57; 438/89; 438/682; 438/683; 257/E21.006; 257/E21.199; 257/E21.2

(58) Field of Classification Search .................. None
See application file for complete search history.

(56) References Cited

U.S. PATENT DOCUMENTS
8,058,092 B2 * 11/2011 Lee et al. ................ 438/57
* cited by examiner

*Primary Examiner* — Seahvosh Nikmanesh
(74) *Attorney, Agent, or Firm* — Kilpatrick Townsend & Stockton LLP

(57) ABSTRACT

A method for providing a semiconductor material for photovoltaic devices, the method includes providing a sample of iron disilicide comprising approximately 90 percent or greater of a beta phase entity. The sample of iron disilicide is characterized by a substantially uniform first particle size ranging from about 1 micron to about 10 microns. The method includes combining the sample of iron disilicide and a binding material to form a mixture of material. The method includes providing a substrate member including a surface region and deposits the mixture of material overlying the surface region of the substrate. In a specific embodiment, the mixture of material is subjected to a post-deposition process such as a curing process to form a thickness of material comprising the sample of iron disilicide overlying the substrate member. In a specific embodiment, the thickness of material is characterized by a thickness of about the first particle size.

34 Claims, 7 Drawing Sheets

METHOD AND MATERIAL FOR PROCESSING IRON DISILICIDE FOR PHOTOVOLTAIC APPLICATION

CROSS-REFERENCES TO RELATED APPLICATIONS

This application is a continuation of and claims priority to U.S. Non provisional patent application Ser. No. 12/210,173, filed Sep. 12, 2008, which in turn claims priority to U.S. Provisional Patent Application No. 60/976,317, filed Sep. 28, 2007, the contents of both the applications are incorporated by reference herein in their entirety for all purposes.

BACKGROUND OF THE INVENTION

The present invention relates generally to photovoltaic materials. More particularly, the present invention provides a method and structure for processing semiconductor materials used for the manufacture of photovoltaic devices. Merely by way of example, the present method and structure have been implemented using a commercial source of iron disilicide, but it would be recognized that the invention may have other configurations.

From the beginning of time, mankind has been challenged to find ways of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on Earth. Additionally, as more people use petrochemicals in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from our sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to embodiments of the present invention, more particularly, the present invention provides a method and structure for processing semiconductor materials used for the manufacture of photovoltaic devices. More particularly, embodiments according the present invention provide an iron disilicide material comprises substantially of beta phase iron disilicide. Merely by way of example, the iron disilicide material has been used as a thin film material for photovoltaic device fabrication. But it should be recognized that embodiments according to the present invention have a much broader range of applicability.

In a specific embodiment, a method for forming a semiconductor material for photovoltaic devices is provided. The method includes providing a sample of iron disilicide. In a specific embodiment, the sample of iron disilicide comprises approximately 90 percent or greater of a beta phase entity and characterized by a first particle size. The method includes combining the sample of iron disilicide and a binding material to form a mixture of material. The method also provides a substrate member including a surface region. The method deposits the mixture of material overlying the surface region of the substrate and forms a thickness of material overlying the substrate member using a post-deposition process such as a curing process. In a specific embodiment, the thickness of material comprising the sample of iron disilicide may be engineered. Preferably, the thickness of material is characterized by a thickness of about the first particle size.

Depending upon the specific embodiment, one or more benefits may be achieved. The present technique uses environmentally clean materials that are non-toxic. Additionally, the method provides a process that is compatible with conventional process technology without substantial modifications to conventional equipment and processes. Depending on the composition and morphology of the mixture of materials, various material properties of the mixture can be engineered such as the electrical resistivity, carrier density, carrier mobility, and absorption coefficient. Depending upon the embodiment, one or more of these benefits may be achieved /and one or more of these properties can be engineered. These properties and other benefits will be described in more detail throughout the present specification and more particularly below.

Various additional objects, features and advantages of the present invention can be more fully appreciated with reference to the detailed description and accompanying drawings.

DETAILED DESCRIPTION OF THE INVENTION

According to embodiments of the present invention, a method and material directed to photovoltaic device fabrication are provided. More particularly, embodiments according the present invention provide an iron disilicide material comprised substantially of beta phase iron disilicide. Merely by way of example, the iron disilicide material has been used as a material for photovoltaic device fabrication. But it should be recognized that embodiments according to the present invention have a much broader range of applicability.

Figure 1:
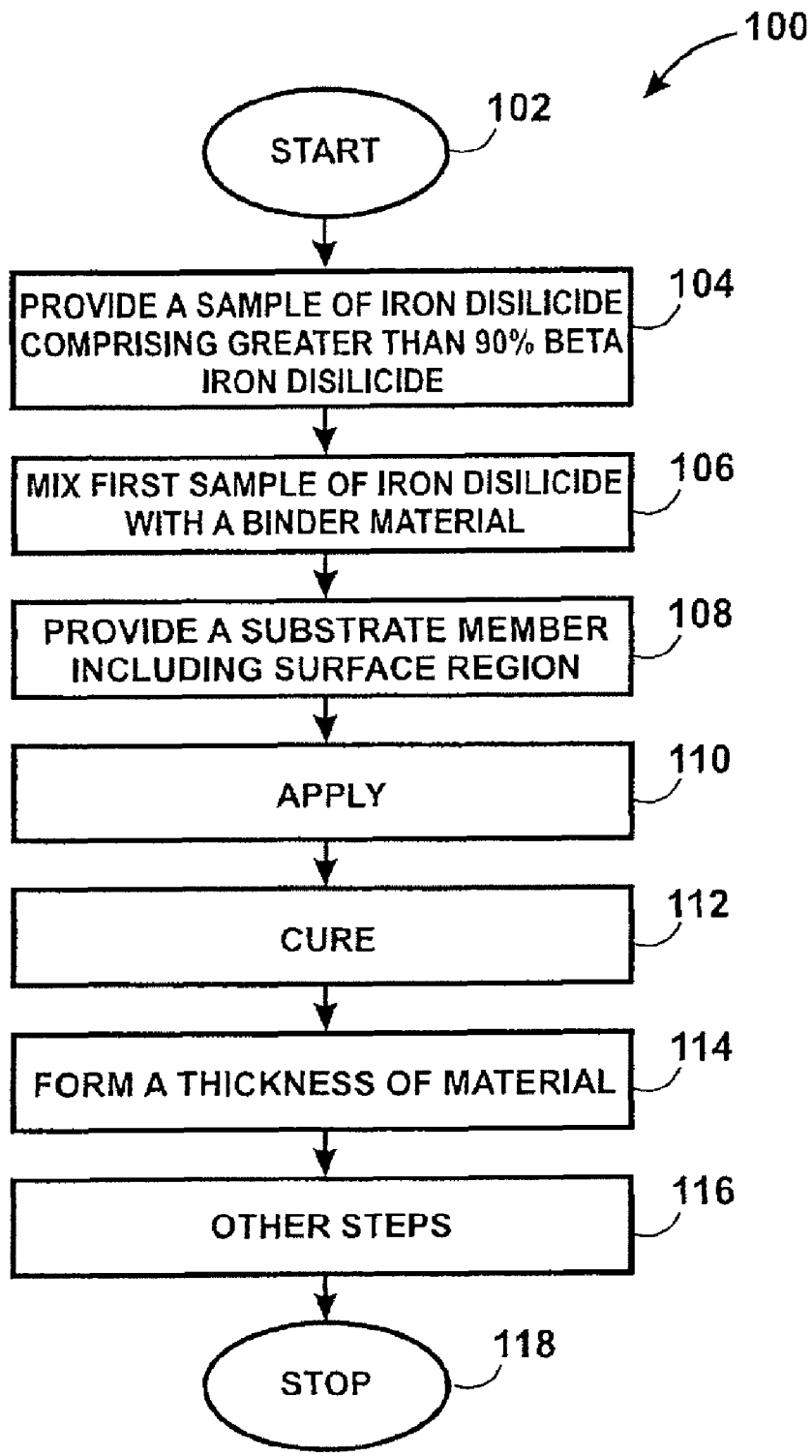
FIG. 1 is a simplified flow diagram illustrating a method of forming a sample of semiconductor material for manufacturing photovoltaic devices according to an embodiment of the present invention.

FIG. 1 is a simplified flow diagram 100 illustrating a method for processing a sample of beta phase iron disilicide according to an embodiment of the present invention. The method may be summarized as follow:

1. Step 102, start;
2. Step 104, provide a sample of iron disilicide, comprises substantially beta phase iron disilicide (for example, approximately 90 percent or greater);
3. Step 106, mix the sample of iron disilicide with a binder material to form a mixture of material;
4. Step 108, provide a substrate including a surface region;
5. Step 110, apply the first mixture of material overlying the surface region;
6. Step 112, cure;
7. Step 114, form a thickness of material comprising the sample of iron disilicide overlying the surface region;
8. Step 1166, perform other steps;
9. Step 118, Stop.

The above sequence of steps provides a method of forming a thin film of iron disilicide material overlying a substrate comprising substantially of beta phase iron disilicide according to an embodiment of the present invention. As shown the method uses a combination of steps to form a thin film material comprising a binding material and beta phase iron disilicide. Merely by way of example, the present method has been used in fabricating photovoltaic devices. But it should be recognized that the present invention has a much broader range of applicability.

Figure 2:
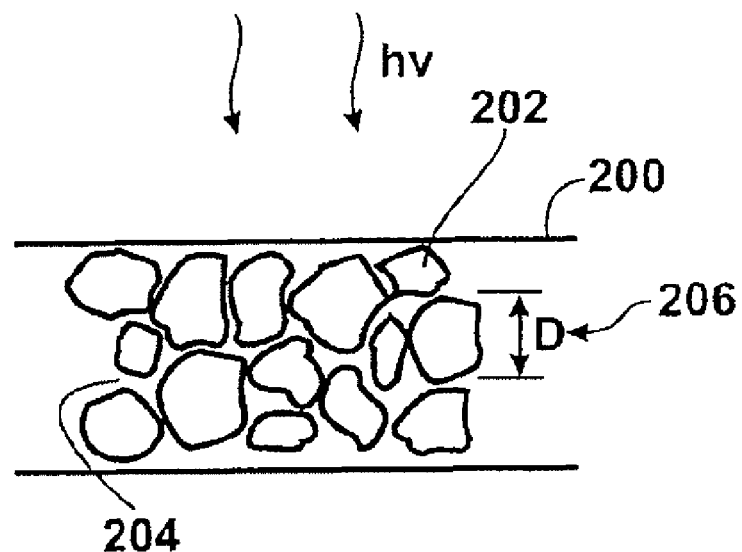
FIG. 2-3 are simplified diagrams illustrating conventional materials for manufacturing photovoltaic devices.

FIG. 2 is a simplified diagram illustrating a first conventional photovoltaic material 200. As shown, the first conventional sample comprises a plurality of particles 202 provided within a thickness 208. The photovoltaic material may be metal oxides, metal sulfides, metal silicides, and others. Each of the plurality of particles is characterized by a dimension 206. As shown, each of the particles has a grain boundary region 204 formed by adjacent particles. The grain boundary regions provide recombination sites for electrons and holes and affect the performance of photovoltaic devices.

Figure 3:
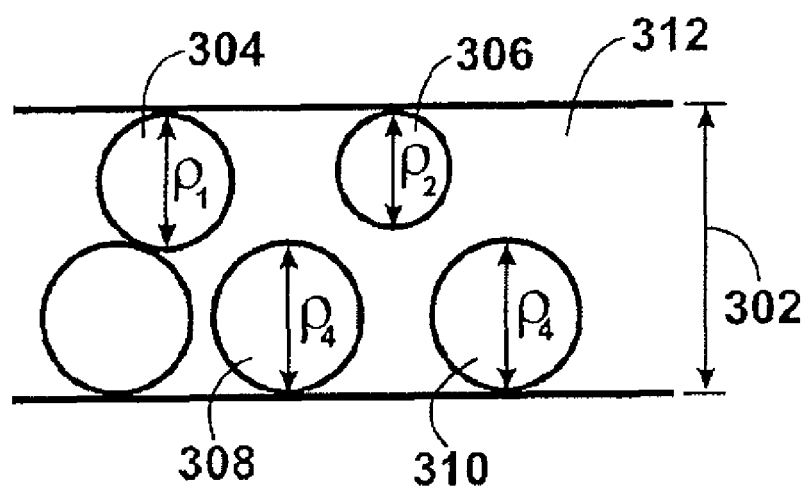

FIG. 3 is a simplified diagram illustrating a second conventional photovoltaic material 300. The second photovoltaic material may be provided within an optional binding material 312. The second conventional sample of photovoltaic material has a thickness of 302. The photovoltaic material, again, can be metal oxides, metal sulfides, metal silicides, and others. The second conventional photovoltaic material comprises a plurality of particles each characterized by a particle size. For example, particle 304 has a dimension of P1, particle 306 has a dimension of P2, particle 308 has a dimension of P3, and particle 310 has a dimension of P4. As shown, each of the particle size is less than the thickness of the film. As shown, particle 308 is shadowed by particles 304 and 306. Particle 310 is shadowed by particle 306. Such shadowing affects the absorption of electromagnetic radiation for particles 303 and 306 and the efficiency of the photovoltaic device.

Figure 4:
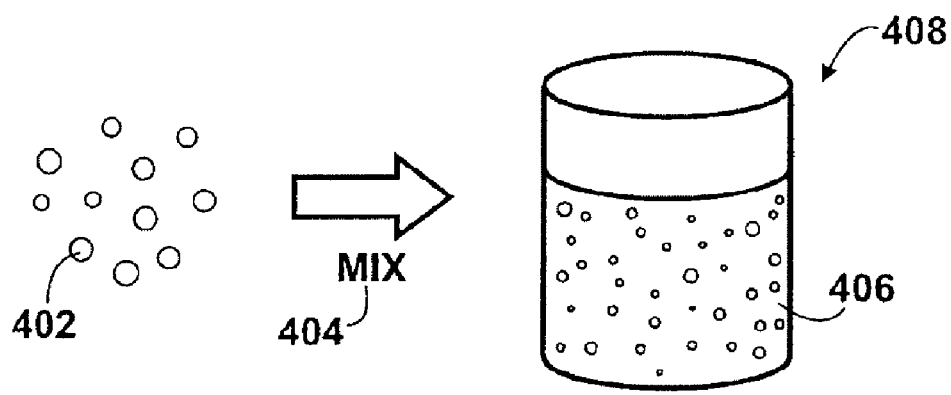
FIG. 4-6 are simplified diagrams illustrating a method of forming semiconductor materials for manufacturing photovoltaic devices according to an embodiment of the present invention.
Figure 5:
Figure 6:
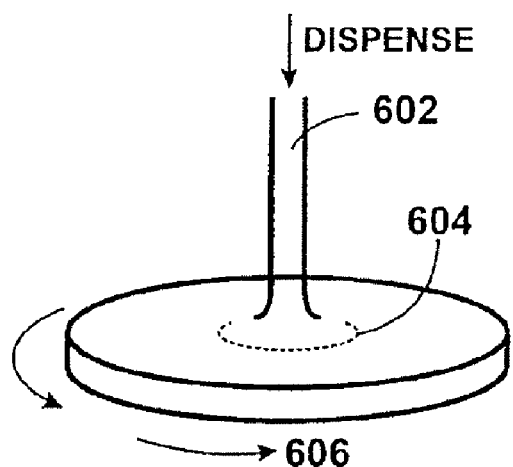

Referring to FIG. 4-6, a method of forming a thin film of photovoltaic material according to an embodiment of the present invention is provided. As shown, a sample of photovoltaic material is provided. In a specific embodiment, the sample of photovoltaic material includes a sample of iron disilicide 402 comprises approximately 90 percent or greater of beta phase iron disilicide. In a specific embodiment, the sample of iron disilicide is characterized by a particle size less than about 10 microns. In a preferred embodiment, the sample of iron disilicide is characterized by a particle size ranging from about 1 micron to about 10 microns.

As shown, the method includes mixing the sample of iron disilicide with a binding material 406 to form a mixture of material 408. The binding material may include a variety of materials, and can have desired properties such as optically transparent or absorptive, electrically resistive or conductive, or other properties and variations of these properties depending on the application or embodiment. As examples, the binding material may comprise an organic polymer material, or an inorganic polymer material, a semiconductor material, an insulator material, an amorphous material, or a glassy material such as spin on glass (SOG) material, or mixtures thereof depending on the embodiment. In a specific embodiment, the binding material includes SOG 512B, P-5S, or SOG 2027 from Honeywell Corporation, USA, but can be others. Of course there can be other variations, modifications, and alternatives.

Referring to FIG. 5, the method includes providing a substrate 502 including a surface region 504. The substrate can be a transparent substrate such as glass, quartz, fused silica, polymer material, semiconductor material, insulator material, and others. The substrate can also be a semiconductor, for example, silicon, silicon-germanium, germanium, silicon on insulator, and others. Other substrate may include a metal substrate such a stainless steel, nickel, aluminum, or other suitable metals depending on the application. Of course there can be other variations, modifications, and alternatives.

As shown in FIG. 6, the method dispenses 602 a volume of the mixture of material including the sample of iron disilicide in a center region 604 on the surface region of the substrate. In a specific embodiment, the mixture of material is allowed to distribute evenly on the surface region using a spin coating process 606 known in the art. Of course there can be other variations, modification, and alternatives.

Figure 7:
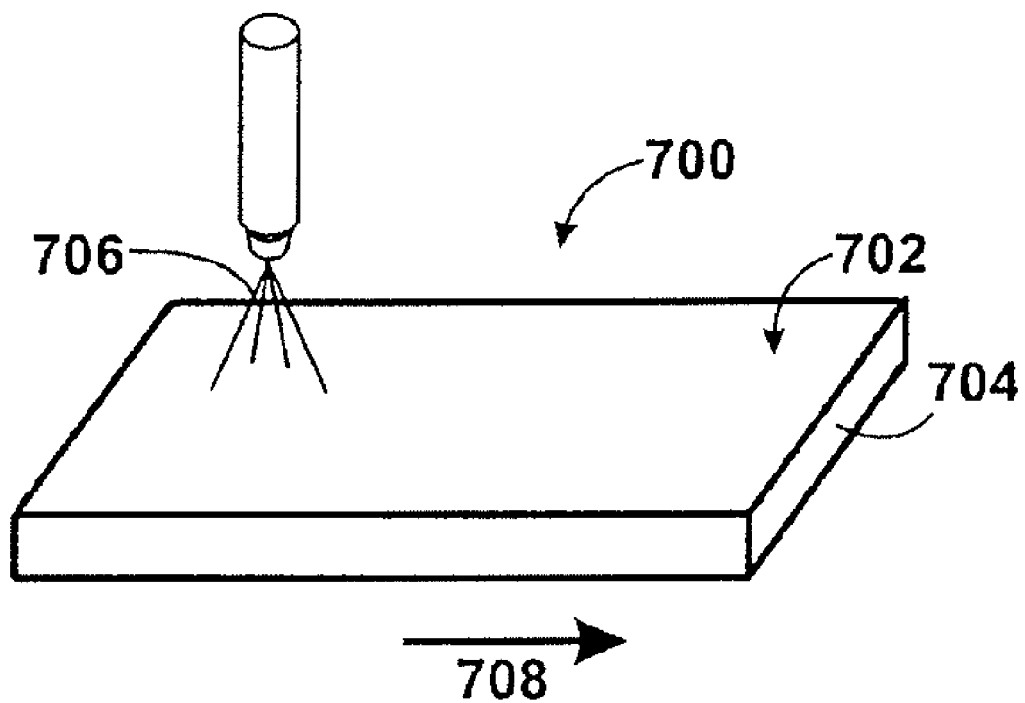
FIG. 7 is a simplified diagram illustrating a method of forming semiconductor materials for manufacturing photovoltaic devices according to an embodiment of the present invention.

FIG. 7 is a simplified diagram illustrating an alternative method 700 of forming a thin film of photovoltaic material overlying a surface region 702 of a substrate member 704 according to an alternative embodiment of the present invention. The substrate member can be a transparent substrate such as glass, quartz, fused silica, polymer material, semiconductor material, insulator material, and others. The substrate member can also be a semiconductor, for example, silicon, silicon-germanium, germanium, silicon on insulator, and others. Other substrate member may include a metal substrate such a stainless steel, nickel, aluminum, or other suitable metals depending on the application. As shown, a mixture of material including the sample of iron disilicide is allowed to be formed overlying the surface region using a spraying process 706. As shown, the substrate member is allowed to translate 708 while the mixture of material is being sprayed on the surface region. Of course there can be other variations, modifications and alternatives.

Figure 8:
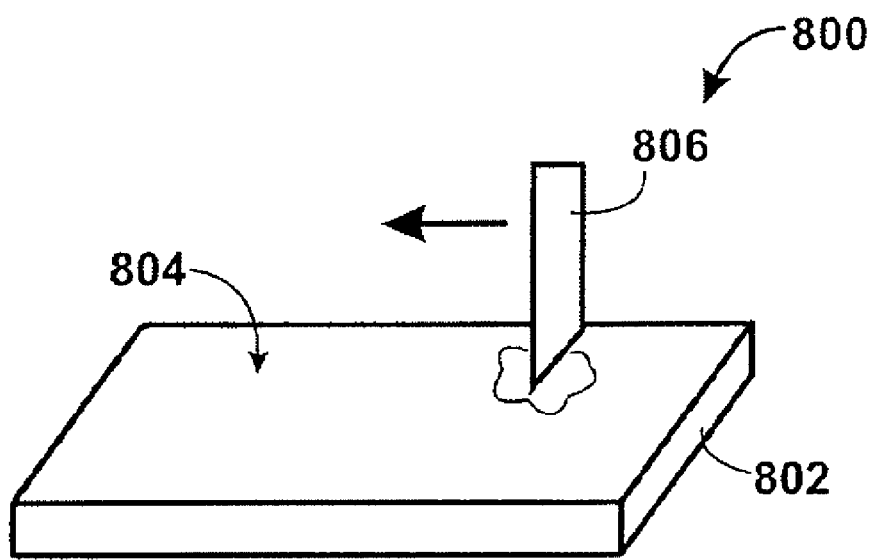
FIG. 8 is simplified diagram illustrating an alternative method of forming semiconductor materials for manufacturing photovoltaic devices according to an embodiment of the present invention.
Figure 8:
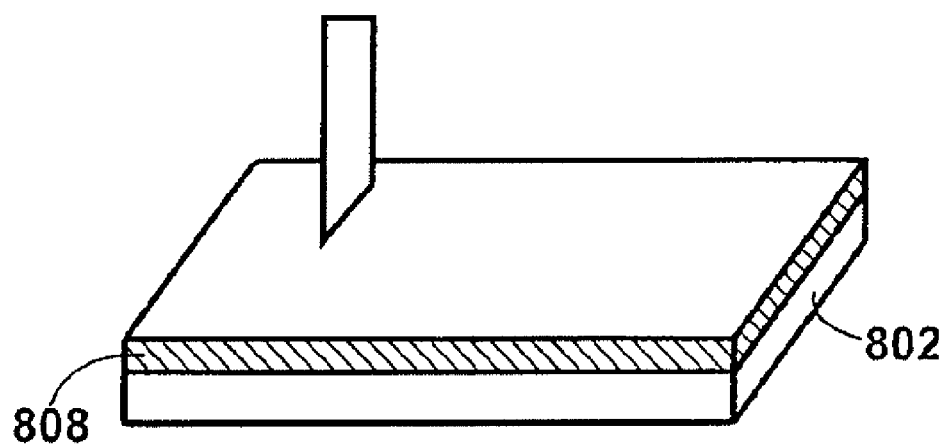

Referring to FIG. 8, a method 800 of forming a thin film of photovoltaic material according to yet an alternative embodiment of the present invention is illustrated. As shown, a substrate member 802 including a surface region 804 is provided. In a specific embodiment, the mixture of material including the beta phase iron silicide is allow to distribute over the surface region of the substrate member using a doctor blade process 806 as shown. A thickness of material 808 including the sample of iron silicide is formed overlying the surface region of the substrate member. Of course there can be other variations, modifications and alternatives.

Figure 9:
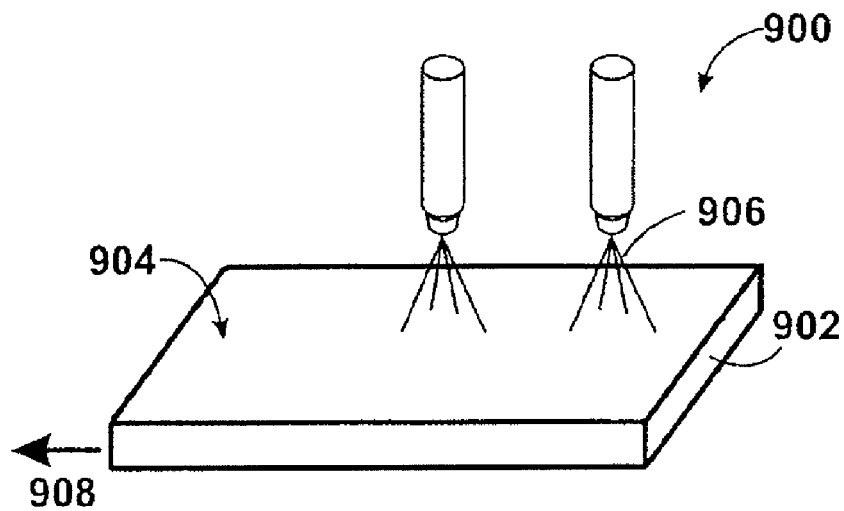
FIG. 9 is simplified diagram illustrating yet an alternative method of forming semiconductor materials for manufacturing photovoltaic devices according to an embodiment of the present invention.

FIG. 9 is a simplified diagram illustrating yet an alternative method 900 of forming a photovoltaic material overlying a surface region 904 of a substrate member 902 according to an alternative embodiment of the present invention. The substrate member can be a transparent substrate such as glass, quartz, fused silica, polymer material, semiconductor material, insulator material, and others. The substrate member can also be a semiconductor, for example, silicon, silicon-germanium, germanium, silicon on insulator, and others. Other substrate member may include a metal substrate such a stainless steel, nickel, or other suitable metals depending on the application. As shown, a mixture of material including the sample of iron disilicide is allowed to be formed overlying the surface region using an inkjet process 906. As shown, the substrate member is allowed to translate 908 while the mixture of material is being provided on the surface region. Of course there can be other variations, modifications and alternatives.

Figure 10:
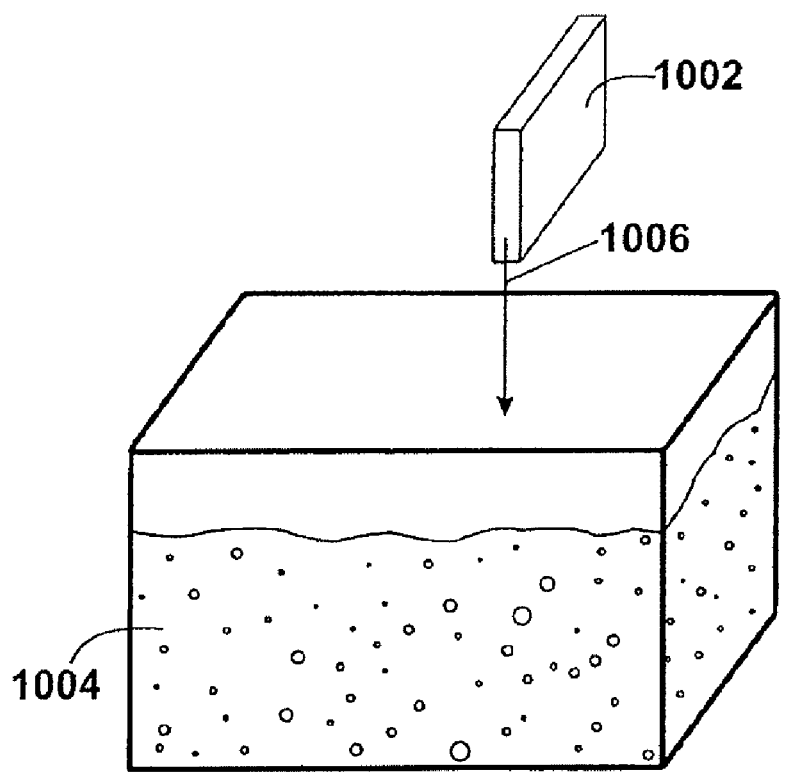
FIG. 10 is simplified diagram illustrating another method of forming semiconductor materials for manufacturing photovoltaic devices according to an embodiment of the present invention.

Referring to FIG. 10, a method of forming a photovoltaic material overlying a substrate member 1002 illustrated. As shown, a mixture of material 1004 comprises beta phase iron disilicide and a binding material is provided. The method includes dip coating 1006 a substrate member including a surface region in the mixture of material to coat the surface region with the mixture of material. Of course there can be other variations, modifications and alternatives.

Figure 11:
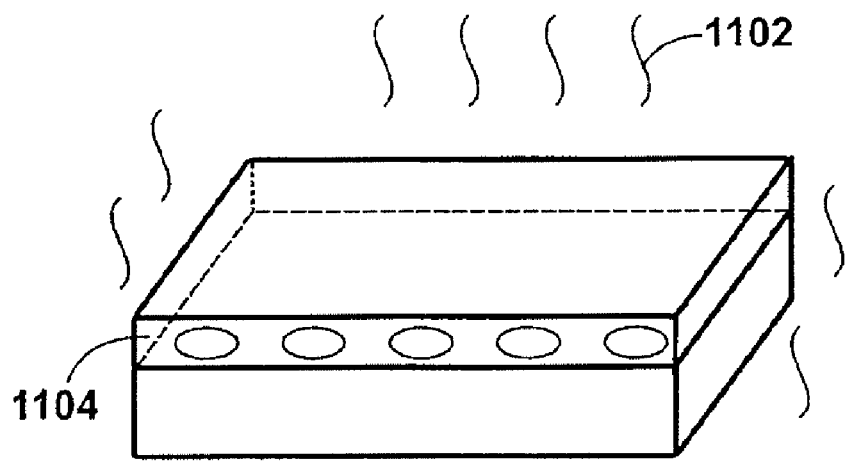
FIG. 11 is simplified diagram illustrating yet another alternative method of forming semiconductor materials for manufacturing photovoltaic devices according to an embodiment of the present invention.

In a specific embodiment, the mixture of material after being deposited on the substrate member is subjected to a post-deposition process to finalize the film formation process. In one embodiment, this post-deposition process includes a curing process 1102 to form a thickness of material 1104 overlying the substrate member as shown in FIG. 11. The curing process may include a thermal process, a photolyzation process such as a UV curing process, a chemical process, or a combination thereof depending on the embodiment. The thermal process may be provided at a temperature ranging from about 100 Degree Celsius to about 450 Degree Celsius in a specific embodiment.

Figure 12:
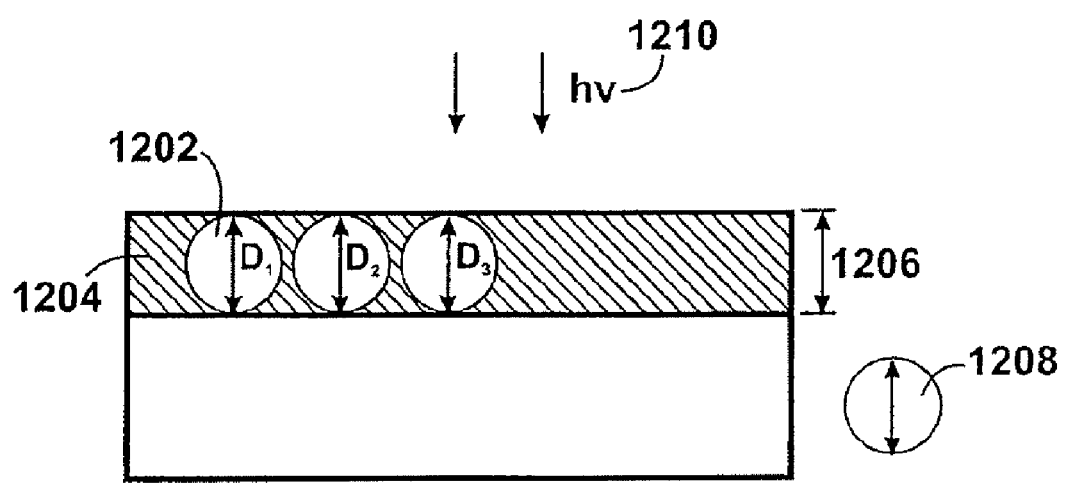
FIG. 12 is a simplified diagram illustrating a sample of semiconductor material for manufacturing photovoltaic devices according to an embodiment of the present invention.

FIG. 12 is a more detailed diagram of the thickness of material 1200 according to an embodiment of the present invention. As shown, the thickness of material comprises a plurality of beta phase iron disilicide particles 1202 within a binding material 1204, for example SOG. Each of the beta phase iron disilicide particles is characterized by a dimension 1208, for example, about 1 micron to 10 microns and substantially uniform, that is, D1~D2~D3 as shown in FIG. 12. In a specific embodiment, the thickness of material has a thickness 1206 about the same dimension of each of the beta phase iron disilicide particles. As shown, each of the beta phase iron disilicide particles is exposed to electromagnetic radiation 1210 and not blocked or shadowed by other particles, improving the efficiency of the photovoltaic device. Of course there can be other variations, modifications, and alternatives.

The present invention has been substantially described using beta phase iron disilicide as the photovoltaic material. Other suitable semiconductor materials such as zinc sulfide, zinc oxide, or others may also be used. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a semiconductor material for photovoltaic devices, the method comprising:
    providing a sample of semiconductor material, the sample of semiconductor material being characterized by a first particle size;
    combining the sample of semiconductor material and a binding material to form a mixture of material;
    depositing the mixture of material overlying a surface region of a substrate member; and
    forming a thickness of the mixture of material overlying the substrate member, the thickness of the mixture of material being characterized by a thickness of about the first particle size.

2. The method of claim 1 wherein the sample of semiconductor material comprises approximately 90 percent or greater of a beta phase entity.

3. The method of claim 1 wherein forming the thickness of material overlying the substrate member further comprises using a post-deposition process such as a curing process.

4. The method of claim 1 wherein the sample of semiconductor material comprises greater than about 95 percent of beta phase iron silicide.

5. The method of claim 1 wherein the first particle size ranges from about 1 micron to about 10 microns.

6. The method of claim 1 wherein the first particle size ranges from about 1 micron to about 5 microns.

7. The method of claim 1 wherein the first particle size ranges from about 1 micron to about 2 microns.

8. The method of claim 1 wherein the thickness of material is formed using a spin coating process, a spraying process, an inkjet process, or a doctor blading process.

9. The method of claim 1 wherein the thickness of material is formed by dip coating the substrate member in the mixture of material.

10. The method of claim 1 wherein the binding material is transparent to electromagnetic radiation.

11. The method of claim 1 wherein the binding material is selected from an organic polymer material, an inorganic polymer material, or a spin on glass (SOG) material.

12. The method of claim 1 wherein the post-deposition process can be provided by a thermal process, a UV curing process, a chemical process, or a combination.

13. The method of claim 10 wherein the thermal process is provided at a temperature ranging from 100 Degree Celsius to about 450 Degree Celsius for a time period ranging from about 5 minutes to about 240 minutes.

14. The method of claim 1 wherein the substrate member can be a transparent substrate such as glass, quartz, fused silica, polymer, semiconductor, insulator, and others.

15. The method of claim 1 wherein the substrate member can be a semiconductor such as silicon, polysilicon, silicon-germanium, germanium, silicon on insulator, and others.

16. The method of claim 1 wherein the substrate member can be a multilayered material.

17. The method of claim 1 wherein the substrate member can be a metal.

18. A method for forming a semiconductor material for photovoltaic devices, the method comprising:
    providing a sample of iron disilicide characterized by a first particle size;
    combining the sample of iron disilicide and a binding material to form a mixture of material;
    depositing the mixture of material overlying a surface region of a substrate member; and
    forming a thickness of material overlying the substrate member, the thickness of material being characterized by a thickness of about the first particle size.

19. The method of claim 18 wherein the sample of iron disilicide comprises approximately 90 percent or greater of a beta phase entity.

20. The method of claim 18 wherein forming the thickness of material overlying the substrate member further comprises using a post-deposition process such as a curing process.

21. The method of claim 18 wherein the sample of iron disilicide comprises greater than about 95 percent of beta phase iron silicide.

22. The method of claim 18 wherein the first particle size ranges from about 1 micron to about 10 microns.

23. The method of claim 18 wherein the first particle size ranges from about 1 micron to about 5 microns.

24. The method of claim 18 wherein the first particle size ranges from about 1 micron to about 2 microns.

25. The method of claim 18 wherein the thickness of material is formed using a spin coating process, a spraying process, an inkjet process, or a doctor blading process.

26. The method of claim 18 wherein the thickness of material is formed by dip coating the substrate member in the mixture of material.

27. The method of claim 18 wherein the binding material is transparent to electromagnetic radiation.

28. The method of claim 18 wherein the binding material is selected from an organic polymer material, an inorganic polymer material, or a spin on glass (SOG) material.

29. The method of claim 18 wherein the post-deposition process can be provided by a thermal process, a UV curing process, a chemical process, or a combination.

30. The method of claim 27 wherein the thermal process is provided at a temperature ranging from 100 Degree Celsius to about 450 Degree Celsius for a time period ranging from about 5 minutes to about 240 minutes.

31. The method of claim 18 wherein the substrate member can be a transparent substrate such as glass, quartz, fused silica, polymer, semiconductor, insulator, and others.

32. The method of claim 18 wherein the substrate member can be a semiconductor such as silicon, polysilicon, silicon-germanium, germanium, silicon on insulator, and others.

33. The method of claim 18 wherein the substrate member can be a multilayered material.

34. The method of claim 18 wherein the substrate member can be a metal.

* * * * *